US008066895B2

(12) United States Patent
Belen et al.

(10) Patent No.: US 8,066,895 B2
(45) Date of Patent: Nov. 29, 2011

(54) METHOD TO CONTROL UNIFORMITY USING TRI-ZONE SHOWERHEAD

(75) Inventors: Rodolfo P. Belen, San Francisco, CA (US); Edward P. Hammond, IV, Hillsborough, CA (US); Brian K. Hatcher, San Jose, CA (US); Dan Katz, San Jose, CA (US); Alexander M. Paterson, San Jose, CA (US); Valentin N. Todorow, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 886 days.

(21) Appl. No.: 12/039,350

(22) Filed: Feb. 28, 2008

(65) Prior Publication Data

US 2009/0218317 A1 Sep. 3, 2009

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/67; 438/710
(58) Field of Classification Search .................... 216/67; 438/710; 156/345.33, 345.34
See application file for complete search history.

(56) References Cited

U.S. PATENT DOCUMENTS

| | | | |
|---|---|---|---|
| 5,427,621 A | 6/1995 | Gupta | |
| 5,498,312 A * | 3/1996 | Laermer et al. | 438/695 |
| 5,549,756 A | 8/1996 | Sorensen et al. | |
| 5,910,221 A | 6/1999 | Wu | |
| 5,990,016 A | 11/1999 | Kim et al. | |
| 6,042,687 A * | 3/2000 | Singh et al. | 156/345.33 |
| 6,059,885 A | 5/2000 | Ohashi et al. | |
| 6,159,297 A | 12/2000 | Herchen et al. | |
| 6,209,480 B1 | 4/2001 | Moslehi | |
| 6,390,019 B1 | 5/2002 | Grimbergen et al. | |
| 6,551,445 B1 | 4/2003 | Yokogawa et al. | |
| 6,676,760 B2 * | 1/2004 | Kholodenko et al. | 118/728 |
| 6,713,127 B2 | 3/2004 | Subramony et al. | |
| 6,736,931 B2 * | 5/2004 | Collins et al. | 156/345.48 |
| 6,755,932 B2 | 6/2004 | Masuda et al. | |
| 6,793,733 B2 * | 9/2004 | Janakiraman et al. | 118/715 |

(Continued)

FOREIGN PATENT DOCUMENTS

JP 2001217227 A 8/2001

OTHER PUBLICATIONS

International Search Report and Written Opinion dated Dec. 2, 2008 for International Application No. PCT/US07/68063. (APPM/010536 PCT).

*Primary Examiner* — Roberts Culbert
(74) *Attorney, Agent, or Firm* — Patterson & Sheridan, L.L.P.

(57) ABSTRACT

Embodiments of the present invention provide apparatus and method for processing a substrate with increased uniformity. One embodiment of the present invention provides an apparatus for processing a substrate. The apparatus comprises a chamber body defining a processing volume, a substrate support disposed in the processing volume, a showerhead disposed in the processing volume opposite to the substrate support, and a plasma generation assembly configured to ignite a plasma from the processing gases in the processing gas in the processing volume. The showerhead is configured to provide one or more processing gases to the processing volume. The showerhead has two or more distribution zones each independently controllable.

23 Claims, 6 Drawing Sheets

U.S. PATENT DOCUMENTS

| | | |
|---|---|---|
| 6,818,096 B2 | 11/2004 | Barnes et al. |
| 6,942,929 B2 | 9/2005 | Han et al. |
| 6,983,892 B2 | 1/2006 | Noorbakhsh et al. |
| 7,163,585 B2 | 1/2007 | Nishimoto et al. |
| 2003/0045131 A1 | 3/2003 | Verbeke et al. |
| 2003/0111961 A1 | 6/2003 | Katz et al. |
| 2004/0027781 A1 | 2/2004 | Hanawa et al. |
| 2004/0173155 A1 | 9/2004 | Nishimoto et al. |
| 2004/0191545 A1 | 9/2004 | Han et al. |
| 2004/0206305 A1 | 10/2004 | Choi et al. |
| 2005/0016684 A1 | 1/2005 | Sun et al. |
| 2005/0056218 A1 | 3/2005 | Sun et al. |
| 2005/0067103 A1 | 3/2005 | Nguyen et al. |
| 2005/0072526 A1 | 4/2005 | Nguyen et al. |
| 2005/0136657 A1 | 6/2005 | Yokoi et al. |
| 2005/0173569 A1 | 8/2005 | Noorbakhsh et al. |
| 2005/0271814 A1 | 12/2005 | Chang et al. |
| 2005/0276566 A1 | 12/2005 | Iimura |
| 2006/0073690 A1 | 4/2006 | Brown et al. |
| 2006/0076109 A1 | 4/2006 | Holland et al. |
| 2007/0139856 A1 | 6/2007 | Holland et al. |
| 2007/0215580 A1 | 9/2007 | Koshiishi et al. |
| 2007/0246443 A1 | 10/2007 | Paterson et al. |
| 2007/0247073 A1 | 10/2007 | Paterson et al. |
| 2007/0247075 A1 | 10/2007 | Kim et al. |
| 2007/0249173 A1 | 10/2007 | Kim et al. |
| 2007/0249182 A1 | 10/2007 | Mani et al. |
| 2007/0251917 A1 | 11/2007 | Bera et al. |
| 2007/0256785 A1 | 11/2007 | Pamarthy et al. |
| 2008/0202609 A1 | 8/2008 | Gold et al. |

* cited by examiner

METHOD TO CONTROL UNIFORMITY USING TRI-ZONE SHOWERHEAD

BACKGROUND

1. Field

Embodiments of the present invention generally relate to method and apparatus for processing a semiconductor substrate. More particularly, embodiments of the present invention provide method and apparatus for processing a semiconductor substrate with improved uniformity.

2. Description of the Related Art

When processing substrates in a plasma environment, the uniformity of the plasma will affect the uniformity of processing. For example, in an etching process, more material is likely to be removed or etched from the substrate near the center of the substrate as compared to the edge of the substrate when plasma of the processing gases is greater in the area of the chamber corresponding to the center of the substrate. Similarly, if the plasma is greater in the area of the chamber corresponding to the edge of the substrate, more material may be removed or etched from the substrate at the edge of the substrate compared to the center of the substrate Non-uniformity in plasma processes can significantly decrease device performance and lead to waste because the deposited layer or etched portion is not consistent across the substrate.

Excellent process uniformity has become increasingly important as semiconductor devices become continuously more complex. Uniformity is important in both the feature-scale (<1 micron) and the wafer-scale (300 mm). Non-uniformities arise from a variety of reasons, for example variation of concentration of different ingredients of a processing gas, such as etching and passivating species, ion bombardment flux and energy, and temperature within the feature profile and across the wafer.

One of the non-uniformities observed is CD (critical dimension) bias edge roll-off. CD bias refers to the difference between the critical dimension of a feature before and after processing. CD bias edge roll-off refers to decrease of CD bias toward an edge of a substrate compared to CD bias near a central region of the substrate.

FIG. 1 schematically illustrates a CD bias edge roll-off of a hard mask etching process in a gate etching application. FIG. 1 demonstrates a critical dimension from bottom measurement of isolated features across a radius of a substrate after etching. The x-axis of FIG. 1 indicates a distance from the center of the substrate, and the y-axis indicates a critical dimension measurement. The CD bias edge roll-off is obvious from the decrease of the critical dimension measurement from 110 mm to 150 mm, i.e. towards the edge of the substrate. Additionally, FIG. 1 also illustrates non-uniformity near a center of the substrate where the critical dimension measurements are lower than a middle section of the substrate.

Traditionally, non-uniformity during etch, such as the CD bias edge roll-off shown in FIG. 1, is controlled by maintaining a temperature gradient across the substrate using heaters in the substrate support. However, in most applications, adjusting the substrate temperature gradient is still an inadequate method to tune the CD bias edge roll-off.

Therefore, there is a need for apparatus and method for processing a semiconductor substrate with reduced CD bias edge roll-off and other non-uniformity.

SUMMARY

Embodiments of the present invention generally provide apparatus and methods for processing a semiconductor substrate. Particularly, the embodiments of the present invention provide apparatus and method for processing a substrate with increased uniformity.

One embodiment of the present invention provides an apparatus for processing a substrate comprising a chamber body defining a processing volume, a substrate support disposed in the processing volume, a showerhead disposed in the processing volume opposite to the substrate support, wherein the showerhead is configured to provide one or more processing gases to the processing volume, the showerhead has two or more distribution zones each independently controllable, and a plasma generation assembly configured to ignite a plasma from the processing gases in the processing gas in the processing volume.

Another embodiment of the present invention provides a method for processing a substrate comprising positioning the substrate on a substrate support disposed in a plasma chamber, flowing a first processing gas towards a top surface of the substrate, flowing a second processing gas towards an edge region of the substrate, wherein the first processing gas and the second processing gas are different, and striking a plasma of the processing gases in the plasma chamber.

Yet another embodiment of the present invention provides a method for adjusting process uniformity in an etching process comprising positioning a substrate on a substrate support disposed in a plasma chamber, flowing processing gases to the plasma chamber, wherein flowing the processing gases comprises flowing a first processing gas towards a central region of the substrate being processed at a first flow rate, flowing the first processing gas towards a region radially outwards the central region of the substrate at a second flow rate, and flowing a second processing gas towards an edge region of the substrate, and generating a plasma of the processing gases in the plasma chamber.

BRIEF DESCRIPTION OF THE DRAWINGS

So that the manner in which the above recited features of embodiments of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide apparatus and method for improving process uniformity. More particularly, the embodiments of the present invention provide apparatus and method for CD bias uniformity and edge roll-off. In one embodiment, a multi-zone showerhead is used for an etching process. In one embodiment, additional passivating gas is supplied to a plasma chamber from an outermost zone of the multi-zone showerhead while processing gas comprising both etching gas and passivating gas is supplied from one or more inner zones of the showerhead. Edge roll-off may be reduced by adjusting the passivating gas provided from the outermost zone of the showerhead. The overall CD bias uniformity may be adjusted by adjusting a ratio of flow rates among one or more inner zones of the showerhead. In another embodiment, the CD bias may be adjusted by adjusting spacing between the substrate and the showerhead.

Figure 1:
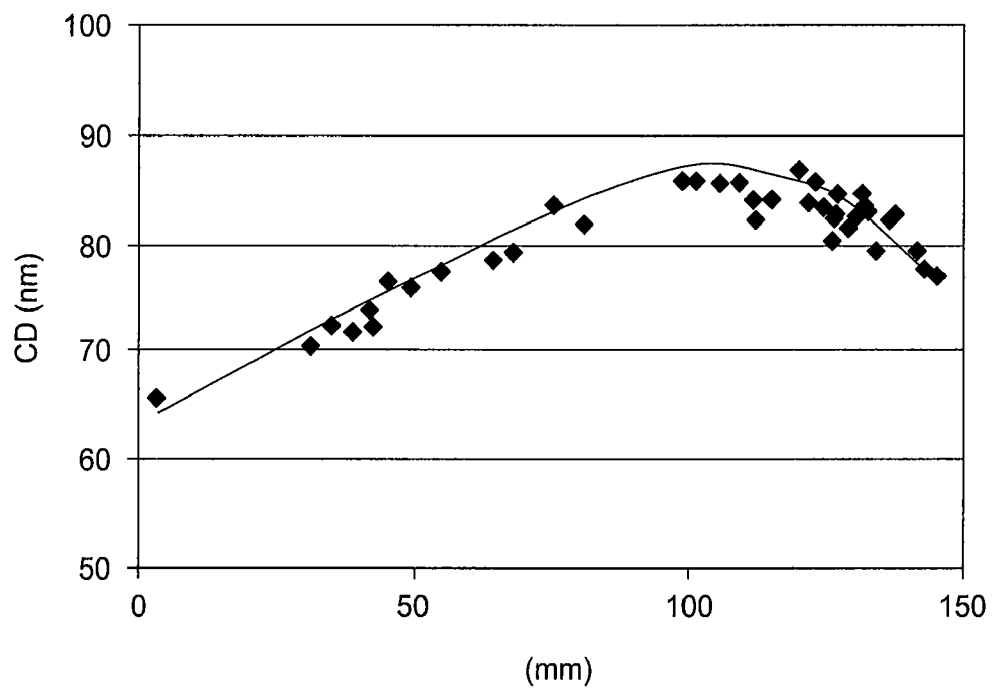
FIG. 1 (prior art) schematically illustrates a CD bias edge roll-off of a hard mask etching process in gate etching application.
Figure 2:
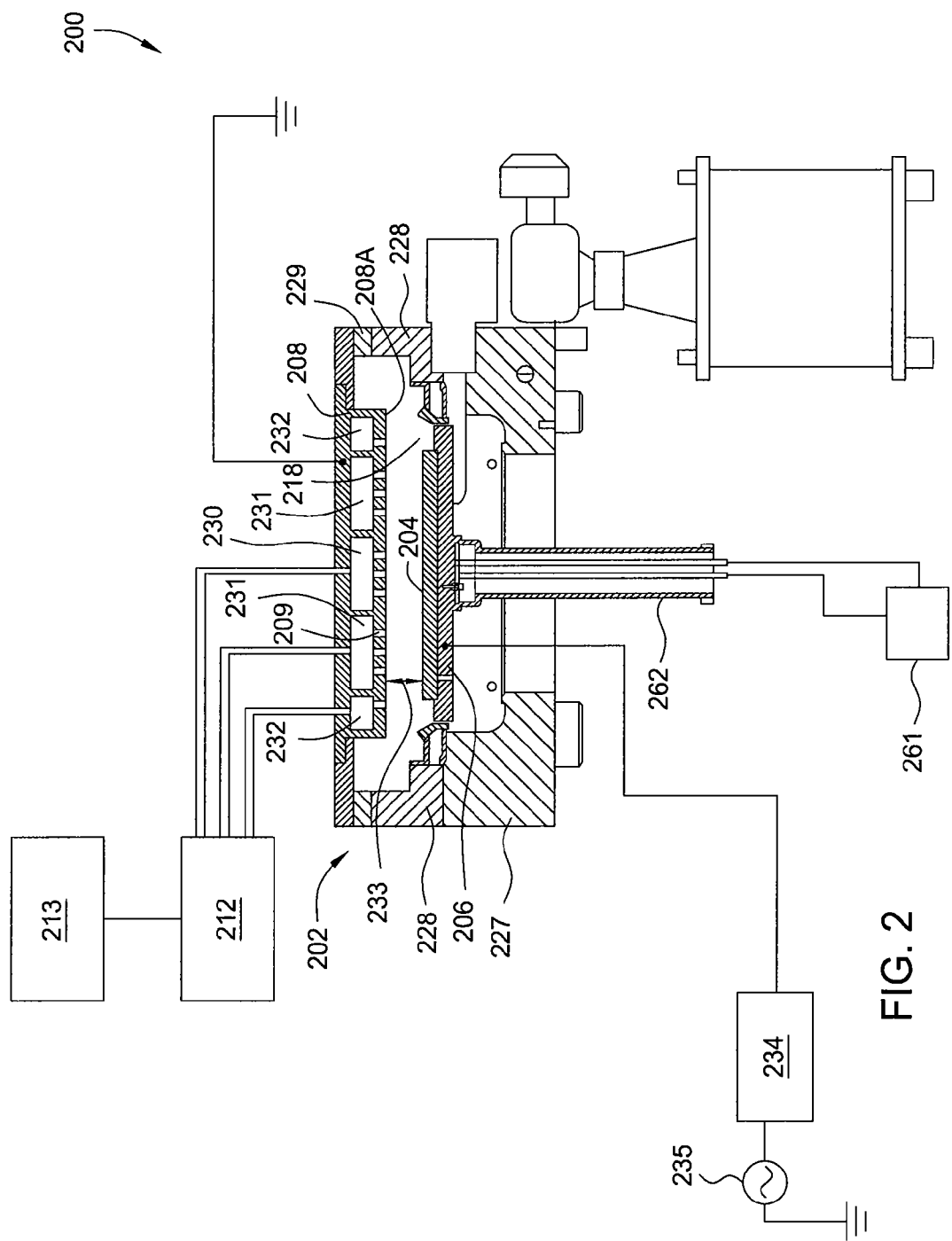
FIG. 2 is a schematic sectional side view of a plasma chamber in accordance with one embodiment of the present invention.

FIG. 2 is a schematic sectional side view of a plasma reactor 200 in accordance with one embodiment of the present invention. The plasma reactor 200 comprises a processing chamber 202 configured to process a substrate 204 therein.

The processing chamber 202 comprises a chamber wall 228, a chamber bottom 227, and a chamber lid 229. The chamber wall 228, chamber bottom 227, and the chamber lid 229 define a processing volume 218.

A substrate support 206 is disposed in the processing volume 218 configured to support the substrate 204 during processing. The substrate support 206 may move vertically and rotate about a central axis driven by a moving mechanism 262. In one embodiment, the substrate support 206 may be a conventional electrostatic chuck that actively holds the substrate 204 during processing.

In one embodiment, the substrate support 206 may be temperature controlled by a temperature controller 261 adapted to cool and heat the substrate support 206 to a desired temperature. The temperature controller 261 may use conventional means, such as embedded resistive heating elements, or fluid cooling channels that are coupled to a heat exchanger.

A showerhead 208 is disposed in the processing volume 218 through the chamber lid 229. The shower head 208 is disposed opposite the substrate support 206 and is configured to provide one or more processing gases to the processing volume 218 through a plurality of holes 209.

In one embodiment, the showerhead 208 may have multiple zones each configured to deliver processing gases to a certain area of the processing volume 218 and certain area of the substrate 204. Each of the multiple zones may be independently connected to the gas source 212, thus, allowing control of gas species and flow rate provided to different areas of the processing volume 218.

In one embodiment, the showerhead 208 may have multiple zones arranged in a concentric manner. As shown in FIG. 2, the showerhead 208 has an inner zone 230 corresponding to a central region of the substrate support 206, an edge zone 232 corresponding to an edge region of the substrate support 206, and a middle zone 231 radially outwards from the inner zone 230 and inwards from the edge zone 232. Each of the inner zone 230, middle zone 231 and edge zone 232 is independently connected to the gas source 212.

The gas source 212 may be a gas panel with multiple outputs each adapted to output an independent flow of an independent combination of species. A system controller 213 may be used to control flow rate and ratio of species provided from the gas source 212 to the inner zone 230, middle zone 231 and edge zone 232.

During processing, a plasma is generated within the processing volume 218 by a plasma generating assembly to process the substrate 204. In one embodiment, the plasma generating assembly may include a capacitor having the showerhead 208 and the substrate support 206 as electrodes. In one embodiment, a RF (radio frequency) power source 235 may be connected to the substrate support 206 through an impedance match network 234, and the showerhead 208 is grounded. A plasma may be generated in the processing volume 218 between the showerhead 208 and the substrate 204 when a RF power is applied to the substrate support 206.

It should be noted that other configurations of plasma may be applied, for example, a capacitive plasma generator with a RF power source applied to the showerhead 208 and the substrate support 206 is grounded, a capacitive plasma generator using electrodes other than the showerhead 208 and the substrate support 206, an inductively coupled plasma generator, or a combination of capacitive and inductive plasma generator. Inductive coils may be disposed above the showerhead 208 of the plasma reactor 200 for generating inductively coupled plasma. Exemplary inductive coupled plasma generator may be found in U.S. patent application Ser. No. 11/960,111, entitled "Apparatus and Method for Processing a Substrate Using Inductively Coupled Plasma Technology," which is incorporated herein by reference.

The showerhead 208 of the plasma reactor 200 is configured to adjust performance across the substrate 204 by adjusting flow rate and gas species supplied to different regions over the substrate 204.

Figure 3:
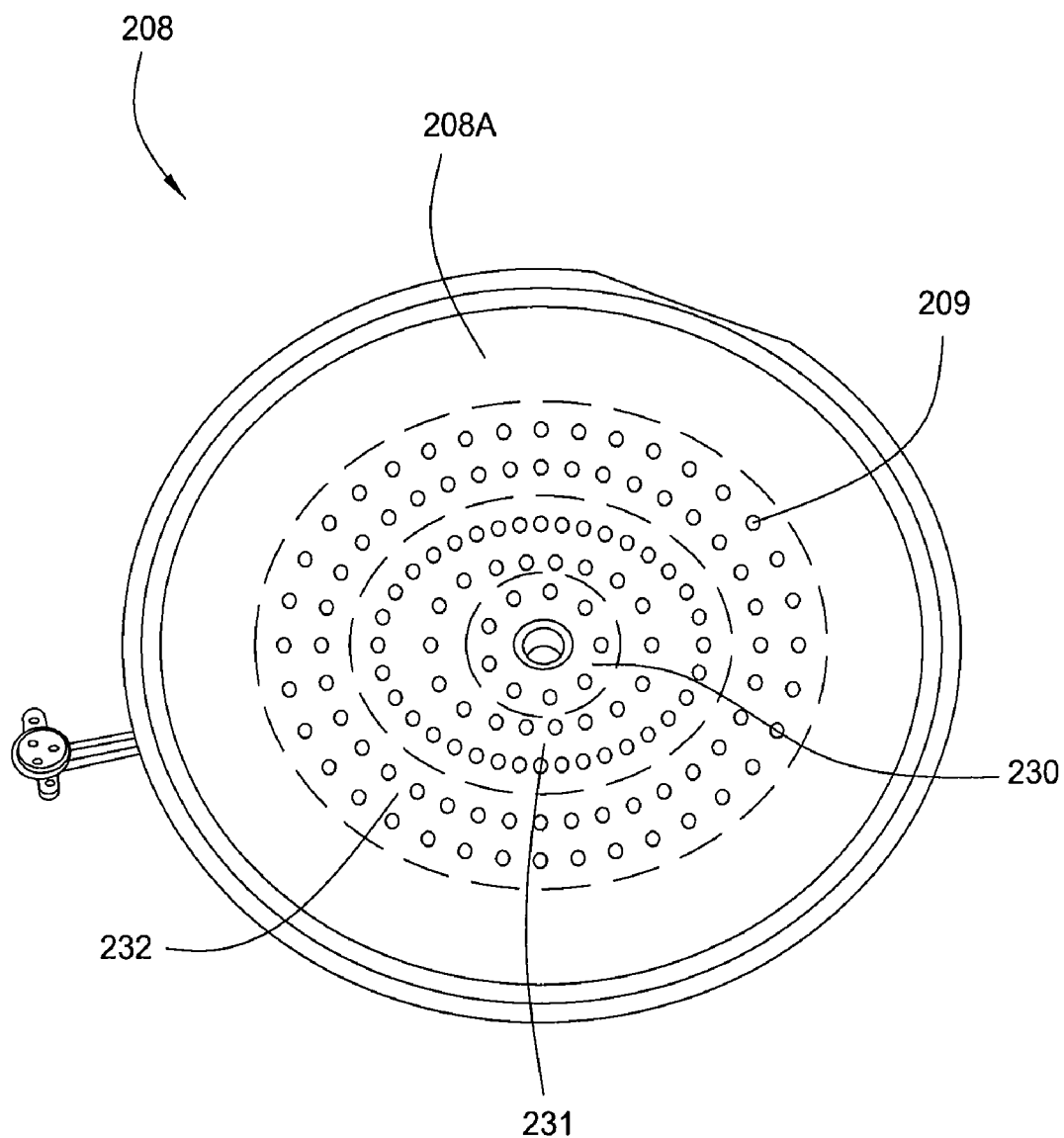
FIG. 3 is a schematic top of a showerhead for a plasma chamber in accordance with one embodiment of the present invention.

FIG. 3 is a schematic bottom view of the showerhead 208 for the plasma reactor 200 of FIG. 2. The showerhead 208 has a substantially circular bottom surface 208a configured to be disposed opposite the substrate support 206 in a parallel manner. The plurality of the holes 209 connects with the gas source 212 through different gas passages. In this configuration, the holes 209 are distributed in the inner zone 230, the middle zone 231 and the edge zone 232. The holes 209 within each of the zones 230, 231, 232 are connected respectively to an output of the gas source 212.

Even though the showerhead 208 described here has three concentric zones for independent gas control, other arrangements, for example, more or less concentric zones, zones of different shapes, may be used for the same purpose.

Embodiments of the present invention provide method for improving process uniformity across a substrate. The method comprises one of adjusting flow rates to different regions of a processing chamber, adjusting components in the processing gas supplied to different regions, adjusting spacing between electrodes of a capacitive plasma generator, or combinations thereof.

FIGS. 4-6 illustrate results from examples of plasma etching processes incorporated with embodiments of the present invention. The examples discussed below are hard mask etching process performed in a capacitive coupled plasma reactor having a showerhead with three zones, similar to the plasma reactor 200 of FIG. 2.

The etching process is generally performed by positioning a substrate to be etched in a plasma chamber, flowing a processing gas into the chamber, and etching the substrate by generating a plasma of the processing gas in the plasma chamber. The processing gas generally comprises an etching gas and a passivating gas mixed in a certain ratio. The processing gas may also comprise a carrier gas. The etching gas may be $CF_4$, $C_2F_6$, $C_4F_8$, $Cl_2$, $BCl_3$, $CCl_4$, $NF_3$, $SF_6$, HBr, $BBr_3$, $C_2F_2$, $O_2$, $H_2$, $CH_4$, COS $SO_2$, and combinations thereof, depending on the material to be etched. The passivating gas may comprise $CHF_3$, $CH_2F_2$, $CH_3F$, $SiCl_4$, HBr, and the combinations thereof, depending on the material to be etched and the etching gas used. The carrier gas may be any inert gas, such as Ar, He, N2, and combinations thereof. It is to be appreciated that other suitable etching gases and passivating gases can also be used.

The examples listed below use a capacitively coupled $CF_4$/$CHF_3$ plasma to etch a silicon nitride hard mask, wherein $CF_4$ acts as etching gas and $CHF_3$ acts as passivating gas. The processing gas, $CF_4$ and $CHF_3$ in this case, is distributed to the chamber through a tri-zone showerhead. Flow rates, gas ratio, and spacing may be adjusted to adjust CD bias result across the substrate.

The showerhead used in the examples has three zones. Zone 1 covers a circular region of about 3.36 inch in diameter corresponding to a central region of the substrate being processed. Zone 2 covers a circular region with an inner diameter of about 3.36 inch and an outer diameter of about 7.68 inch. Zone 3 covers a circular region with an inner diameter of about 7.68 inch and an outer diameter of about 12 inch.

It has been observed that chemical etching processes exhibit a significant loading effect resulting from the depletion of active etching species by reaction with the film being etched. Thus, the etch rate depends on the etchable area either on the feature-scale (microloading) or on the substrate-scale (macroloading). On the feature-scale, microloading is brought about by differences in the feature dimension and pattern density. For example, isolated features etch at a different rate than dense features. Therefore, macroloading and microloading tunability is an essential requisite to a successful etching process. Thus, examples below are performed on both substrates with isolated features and substrates with dense features to examine macroloading and microloading tunability.

Figure 4A:
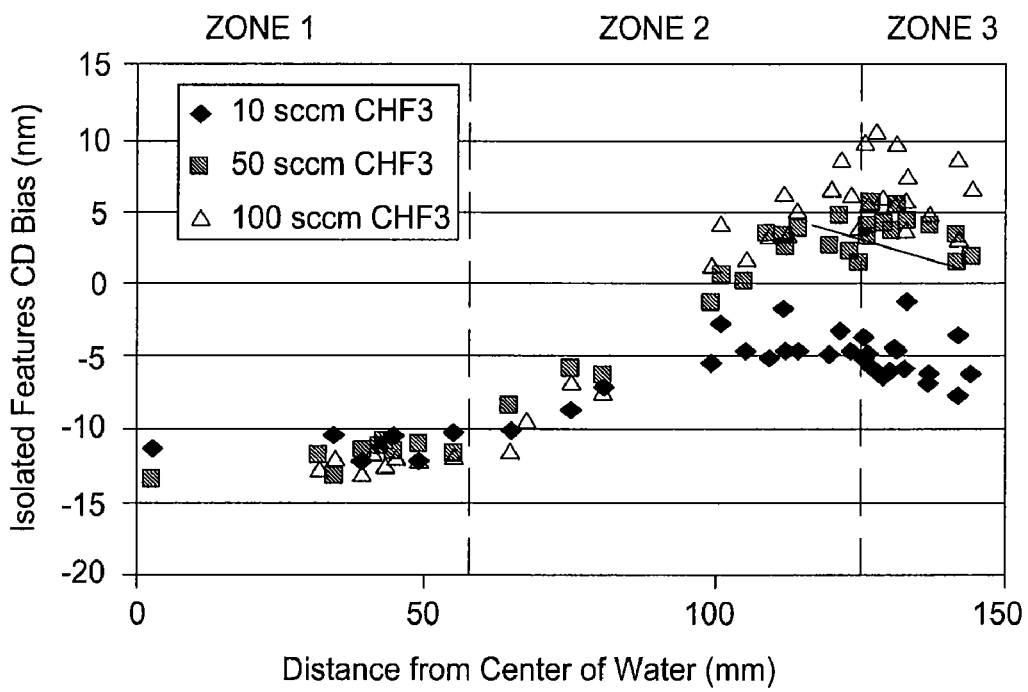
FIGS. 4A-4B illustrate results of a method for reducing CD bias edge roll-off in accordance with one embodiment of the present invention.
Figure 4B:
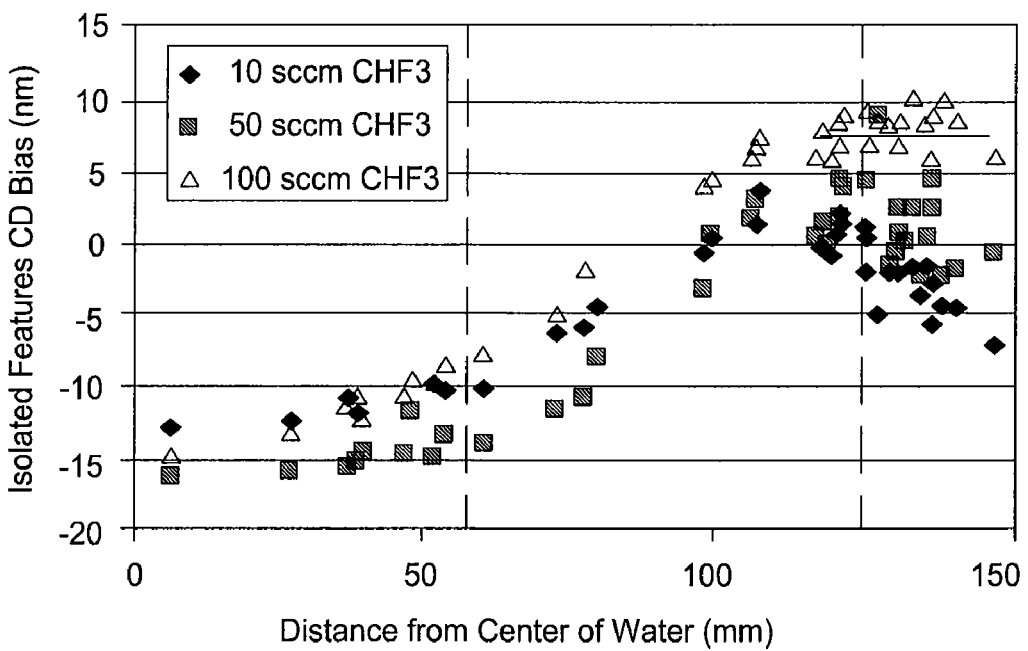

FIGS. 4A-4B illustrate results of a method for reducing CD bias edge roll-off by supplying additional passivating gas to an edge region of the substrate in accordance with one embodiment of the present invention.

Example 1

FIGS. 4A-4B illustrate effects of varying passivating gas flow in Zone 3 while the other processing parameters remain the same. FIG. 4A shows CD bias results for etching on substrates having isolated features. FIG. 4B shows CD bias results for etching on substrates with densely packed features.

The following illustrates an exemplary etching process with the following parameters:
Temperature: about 60° C.
Chamber pressure: about 90 mTorr
Spacing: about 2.3 inch (the distance between shower head and substrate being processed, as shown by distance 233 of FIG. 2)
RF power: about 500 W and 60 MHz
Flow rates in Zone 1: 300 sccm of $CF_4$, 220 sccm of $CHF_3$
Flow rates in Zone 2: 0 sccm of $CF_4$, 0 sccm of $CHF_3$
Flow rates in Zone 3: 0 sccm of $CF_4$, 10/50/100 sccm of $CHF_3$ As shown in FIGS. 4A-4B, edge roll-off is reduced by supplying additional passivating gas $CHF_3$ to Zone 3 for both substrates with isolated features and dense features. Substrates with dense features are more susceptible to edge roll-off. The edge roll-off can be substantially eliminated by flowing 100 sccm passivating gas to Zone 3.

Even though only the passivating gas is supplied near the edge region in Example 1, any adjustment to provide additional passivating gas near the edge region may be applied. For example, both etching gas and passivating gas may be supplied to all regions of the substrate, only a higher ratio of passivating gas is supplied near the edge compared to the central region of the substrate.

Figure 5A:
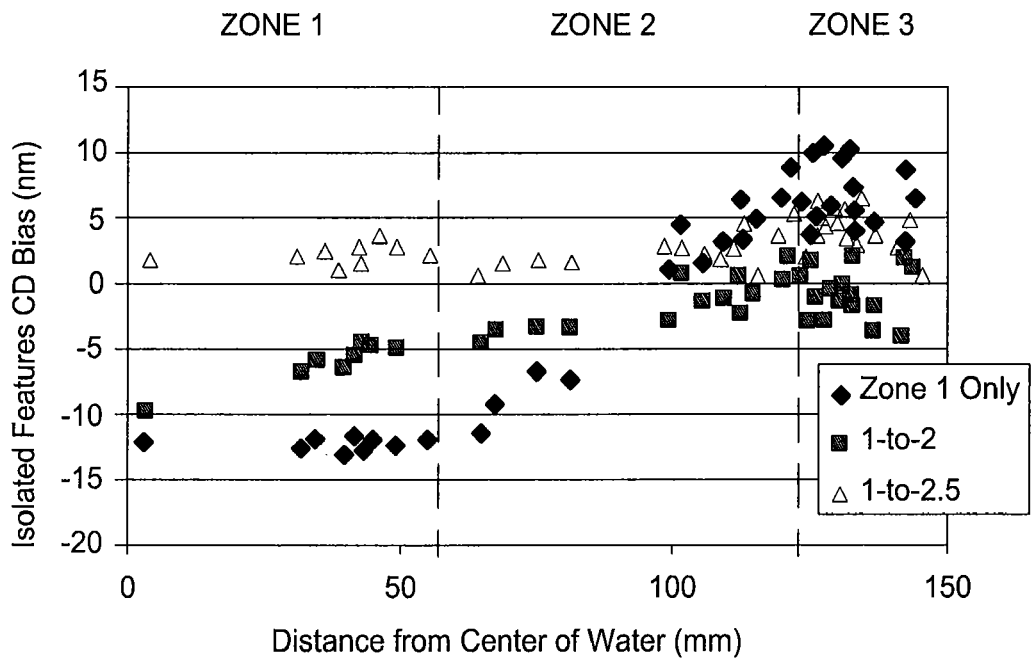
FIGS. 5A-5B illustrate results of a method for improving CD bias uniformity across a substrate in accordance with one embodiment of the present invention.
Figure 5B:
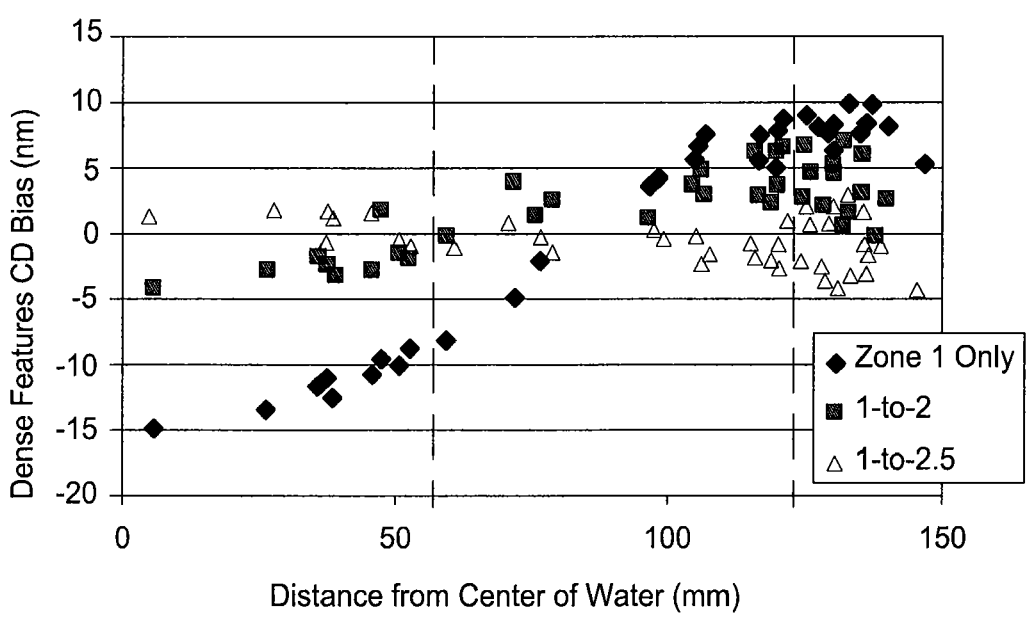

FIGS. 5A-5B illustrate results of a method for improving CD bias uniformity across a substrate by tuning ratio of flow rates among regions of the substrate in accordance with one embodiment of the present invention.

Example 2

FIGS. 5A-5B illustrate effects of varying ratio of flow rates between Zone 1 and Zone 2 while the other processing parameters remain the same. FIG. 5A shows CD bias results for etching on substrates having isolated features. FIG. 5B shows CD bias results for etching on substrates with densely packed features.

The following illustrates an exemplary etching process with the following parameters:
Temperature: about 60° C.
Chamber pressure: about 90 mTorr
Spacing: about 2.3 inch
RF power: about 500 W and 60 MHz
Flow rates in Zone 1: 300*x sccm of $CF_4$, 220*x sccm of $CHF_3$
Flow rates in Zone 2: 300*(1−x) sccm of $CF_4$, 220*(1−x) sccm of $CHF_3$, x=1, 1/3, 1/3.5
Flow rates in Zone 3: 0 sccm of $CF_4$, 100 sccm of $CHF_3$ As shown in FIGS. 5A-5B, CD uniformity is improved by adjusting flow ratio of Zone 1 and Zone 2 for both substrates with isolated features and dense features. Thus, CD uniformity may be improved by adjusting ratio of flow rates of processing gas to different regions of a substrate. Particularly, CD uniformity may be improved by adjusting ratio of flow rate along a radius of a substrate being processed.

Example 3

Figure 6A:
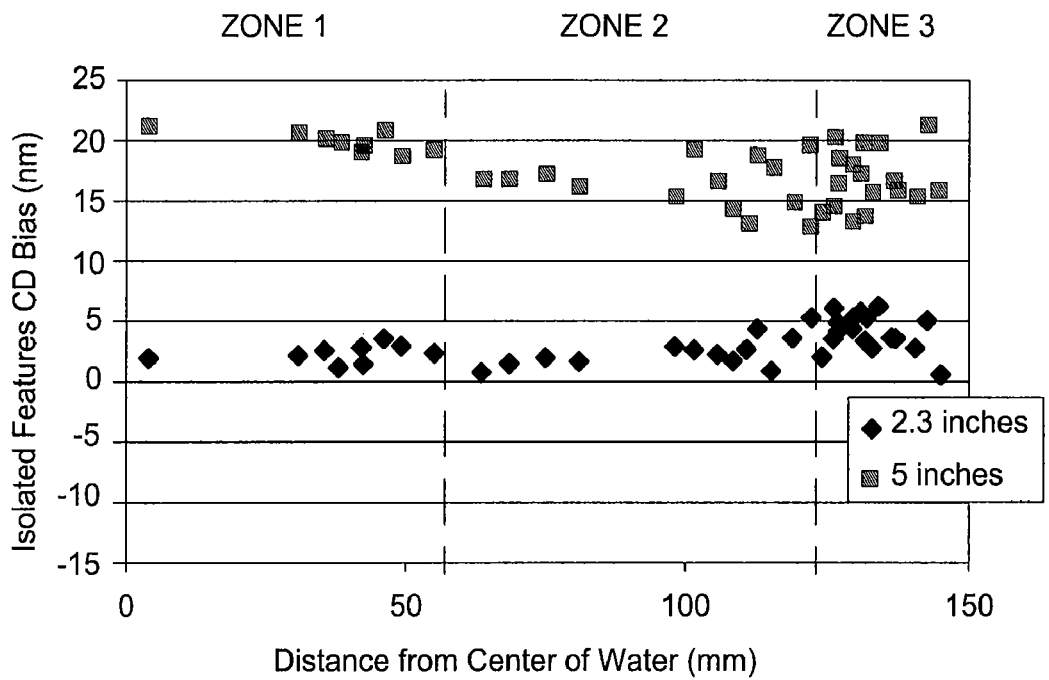
FIGS. 6A-6B illustrate effects of adjusted spacing on CD bias uniformity.
Figure 6B:
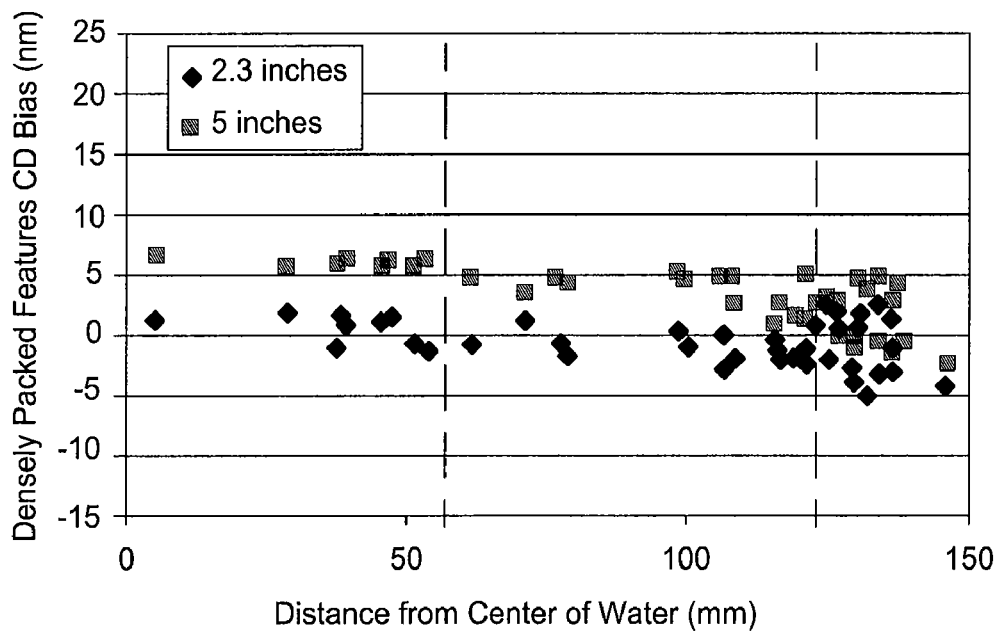

FIGS. 6A-6B illustrate effects of adjusted spacing on CD bias uniformity while the other processing parameters remain the same. FIG. 6A shows CD bias results for etching on substrates having isolated features. FIG. 6B shows CD bias results for etching on substrates with densely packed features.

The following illustrates an exemplary etching process with the following parameters:
Temperature: about 60° C.
Chamber pressure: about 90 mTorr
Spacing: about 2.3 inch/5.0 inch
RF power: about 500 W and 60 MHz
Flow rates in Zone 1: 86 sccm of $CF_4$, 63 sccm of $CHF_3$
Flow rates in Zone 2: 214 sccm of $CF_4$, 146 sccm of $CHF_3$
Flow rates in Zone 3: 0 sccm of $CF_4$, 100 sccm of $CHF_3$ FIGS. 6A-6B illustrate that CD bias may be changed evenly across the substrate by changing the spacing. Substrates with dense features are less responsive to the change of spacing compared to substrates with isolated features. Edge areas are slightly less responsive to the change of spacing.

The approaches illustrated in Examples above may be combined to achieve a desired processing profile across a substrate. Additionally, a desired processing profile may be any profiles depending on a process, for example, a uniform profile, an edge weak profile (where edge areas are processed less than central areas), or an edge strong profile (wherein edge areas are processed more than central areas).

Even though an etching process is described in accordance with embodiments of the present invention, embodiments of the present invention may be applied to improve uniformity across a substrate for any suitable processes, for example deposition and implantation.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
   positioning the substrate on a substrate support disposed in a plasma chamber,
      wherein a showerhead having a bottom surface is disposed in the plasma chamber such that the bottom surface is disposed above the substrate support, and
      wherein the bottom surface of the showerhead comprises an inner distribution zone having a plurality of holes directed to a central region of the substrate support, a middle distribution zone having a plurality of holes directed to a middle region of the substrate support located radially outwards to the central region, and an edge distribution zone having a plurality of holes directed to a region near an edge of the substrate support, such that each of the distribution zones is isolated from the other distribution zones;
   flowing a first processing gas comprising an etching gas through the inner distribution zone towards a top surface of the substrate;
   flowing a second processing gas comprising a passivating gas through the edge distribution zone towards an edge region of the substrate; and
   striking a plasma of the processing gases in the plasma chamber.

2. The method of claim 1, further comprising flowing a third processing gas comprising an etching gas through the middle distribution zone towards a middle region of the substrate located radially outwards to the central region to improve edge performance.

3. The method of claim 1, further comprising:
   flowing the first processing gas through the inner distribution zone at a first flow rate towards a central region of the substrate; and
   flowing the first processing gas through the middle distribution zone at a second flow rate towards a middle region radially outwards the central region of the substrate.

4. The method of claim 3, wherein flowing the first processing gas further comprises adjusting a ratio of the first flow rate and second flow rate to improve process uniformity across the surface of the substrate.

5. The method of claim 4, further comprising adjusting a flow rate of the second processing gas to adjust edge performance.

6. The method of claim 1, wherein the first processing gas comprises the etching gas and a passivating gas.

7. The method of claim 6, wherein flowing the first processing gas further comprises selecting a first flow rate and a first composition to flow through the inner distribution zone, and
   wherein flowing the second processing gas further comprises selecting a second flow rate and a second composition to flow through the edge distribution zone, and
   selecting a third flow rate and a third composition for a third processing gas, and flowing the third processing gas through the middle distribution zone.

8. The method of claim 7, wherein no processing gas is delivered through the middle region of the showerhead.

9. The method of claim 7, further comprising flowing the etching gas and the passivating gas through the middle region of the showerhead.

10. The method of claim 7, further comprising adjusting a distance between the substrate and the showerhead to adjust processing rate.

11. The method of claim 6, wherein the etching gas is selected from the group consisting of $CF_4$, $C_2F_6$, $C_4F_8$, $Cl_2$, $BCl_3$, $CCl_4$, $NF_3$, $SF_6$, HBr, $BBr_3$, $C_2F_2$, $O_2$, $H_2$, $CH_4$, COS, $SO_2$, and combinations thereof.

12. The method of claim 11, wherein the passivating gas is selected from the group consisting of $CHF_3$, $CH_2F_2$, $CH_3F$, $SiCl_4$, HBr, and the combinations thereof.

13. A method for adjusting process uniformity in an etching process, comprising:
   positioning a substrate on a substrate support disposed in a plasma chamber,
      wherein a showerhead having a bottom surface is disposed in the plasma chamber such that the bottom surface is disposed above the substrate support, and
      wherein the bottom surface of the showerhead comprises an inner distribution zone having a plurality of holes directed to a central region of the substrate support, a middle distribution zone having a plurality of holes directed to a middle region of the substrate support located radially outwards to the central region, and an edge distribution zone having a plurality of holes directed to a region near an edge of the substrate support, such that each of the distribution zones is isolated from the other distribution zones;
   flowing processing gases to the plasma chamber, wherein flowing the processing gases comprises:
      flowing a first processing gas independently through the inner distribution zone towards a central region of the substrate being processed at a first flow rate;
      flowing a second processing gas independently through the edge distribution zone at a second flow rate towards an edge region of the substrate, wherein the first processing gas comprises an etching gas and the second processing gas comprises a passivating gas; and
      flowing a third processing gas independently through the middle distribution zone at a third flow rate towards a middle region of the substrate located radially outwards to the central region; and
   generating a plasma of the processing gases in the plasma chamber.

14. The method of claim 13, further comprising adjusting a ratio of the first flow rate and second flow rate to improve process uniformity on feature-scale and substrate-scale.

15. The method of claim 13, further comprising:
   taking a measurement of critical dimension bias edge roll-off in each of the inner, middle and edge regions of the substrate; and
   adjusting a ratio of at least two of the first, second or third flow rates to improve uniformity.

16. The method of claim 15, further comprising adjusting the flow rate of the second processing gas to adjust edge performance.

17. The method of claim 13, wherein the first processing gas comprises the etching gas and a passivating gas.

18. The method of claim 17, wherein the etching gas is selected from the group consisting of $CF_4$, $C_2F_6$, $C_4F_8$, $Cl_2$, $BCl_3$, $CCl_4$, $NF_3$, $SF_6$, HBr, $BBr_3$, $C_2F_2$, $O_2$, $H_2$, $CH_4$, COS, $SO_2$, and combinations thereof.

19. The method of claim 18, wherein the passivating gas is selected from the group consisting of $CHF_3$, $CH_2F_2$, $CH_3F$, $SiCl_4$, HBr, and the combinations thereof.

20. The method of claim 13, further comprising:
taking a measurement of critical dimension bias edge roll-off in each of the inner, middle and edge regions of the substrate; and
adjusting a composition of at least one of the first, second or third processing gases to improve uniformity.

21. The method of claim 20, further comprising using a system controller to adjust at least one of the first, second or third flow rates to improve uniformity.

22. The method of claim 21, wherein generating the plasma comprises applying a RF power between the showerhead and the substrate support.

23. The method of claim 21, further comprising adjusting a distance between the substrate and the showerhead to adjust processing rate.

* * * * *